United States Patent [19]
Wallace

[11] Patent Number: 5,963,078
[45] Date of Patent: Oct. 5, 1999

[54] TRANSFORMER COUPLED FET DRIVE CIRCUIT

[75] Inventor: Kenneth Andrew Wallace, Lewis Center, Ohio

[73] Assignee: Peco II, Inc., Galion, Ohio

[21] Appl. No.: 09/013,132

[22] Filed: Jan. 26, 1998

[51] Int. Cl.[6] ........................................... H03K 17/60
[52] U.S. Cl. ........................ 327/432; 327/365; 327/377
[58] Field of Search ................................ 327/365, 374, 327/377, 379, 380, 381, 419, 427, 432, 493, 583

[56] References Cited

U.S. PATENT DOCUMENTS

| | | | |
|---|---|---|---|
| 3,757,144 | 9/1973 | Hetterscheid et al. | 307/300 |
| 3,983,418 | 9/1976 | Wallace | 307/270 |
| 4,393,316 | 7/1983 | Brown | 307/270 |
| 4,399,500 | 8/1983 | Clarke et al. | 363/97 |
| 4,423,341 | 12/1983 | Shelly | 307/570 |
| 4,455,526 | 6/1984 | Miller | 323/282 |
| 4,481,434 | 11/1984 | Janutka | 307/570 |
| 4,492,883 | 1/1985 | Janutka | 307/571 |
| 4,500,801 | 2/1985 | Janutka | 307/570 |
| 4,709,161 | 11/1987 | Mizohata et al. | 307/270 |
| 4,728,817 | 3/1988 | Jessee et al. | 307/270 |
| 4,748,351 | 5/1988 | Barzegar | 307/571 |
| 4,967,101 | 10/1990 | Nakamura et al. | 307/270 |
| 5,168,182 | 12/1992 | Salerno et al. | 307/571 |
| 5,467,047 | 11/1995 | Robb | 327/377 |
| 5,481,219 | 1/1996 | Jacobs et al. | 327/434 |
| 5,550,497 | 8/1996 | Carobolante | 327/110 |
| 5,594,378 | 1/1997 | Kruse et al. | 327/304 |

*Primary Examiner*—Timothy P. Callahan
*Assistant Examiner*—Jeffrey Zweizig
*Attorney, Agent, or Firm*—Marshall, O'Toole, Gerstein, Murray & Borun

[57] ABSTRACT

A FET drive circuit is disclosed. The disclosed drive circuit develops a unipolar voltage from a bi-polar source voltage and facilitates fast turn-off of the driven FET. Preferably, the drive circuit includes a first diode having a first reverse recovery time, a transistor, and a second diode having a second reverse recovery time which is longer than the first reverse recovery time.

24 Claims, 1 Drawing Sheet

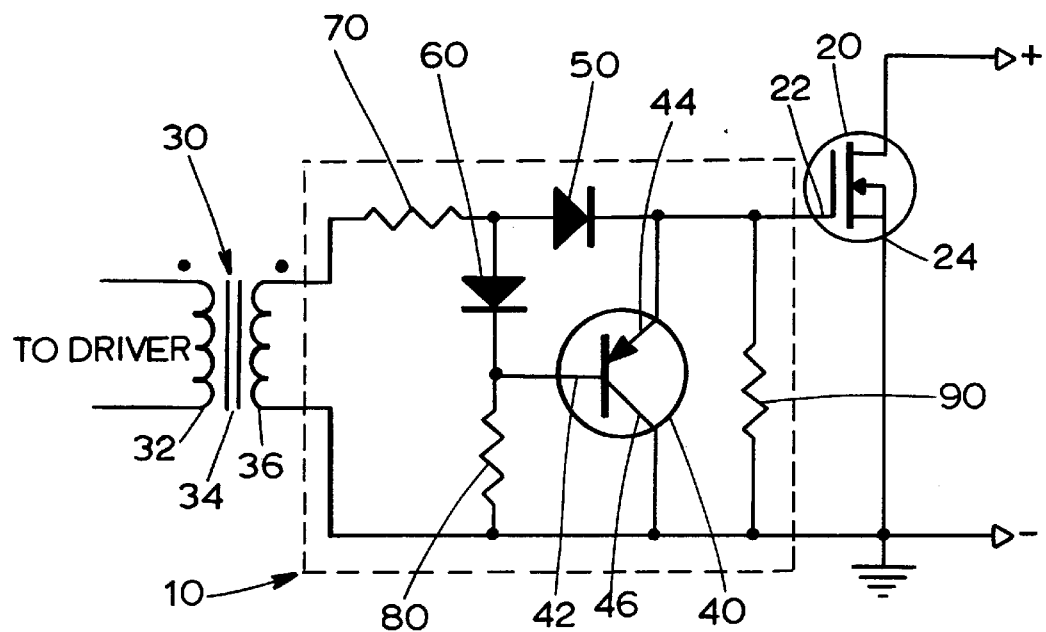

TRANSFORMER COUPLED FET DRIVE CIRCUIT

FIELD OF THE INVENTION

The invention relates generally to switchmode power supplies, and, more particularly, to a transformer coupled FET drive circuit for developing a unipolar drive voltage from a bi-polar source voltage and for facilitating fast turn-off of the driven FET.

BACKGROUND OF THE INVENTION

Switchmode power supplies often employ a drive circuit to couple large FET or MOSFET transistors to a high frequency pulse transformer. In such circumstances, it is typically necessary to swing the FET or MOSFET gate voltage over a relatively large range (such as from +15V to −15V) in order to reset the core flux of the transformer. This voltage swing requirement has caused problems in prior art drive circuits.

For example, prior art drive circuits which require large gate voltage swings are disadvantageous in that they waste energy unnecessarily driving the gate of the FET or MOSFET to a negative level and subsequently returning the gate to an appropriate positive level for the next turn-on. Some such prior art drive circuits are also disadvantaged in that they require excessive turn-off time for the driven FET or MOSFET, and/or they provide excessively hard (i.e., rapid) turn-on of the driven FET or MOSFET.

SUMMARY OF THE INVENTION

In accordance with an aspect of the invention, a FET drive circuit for use with a transformer driven by a bi-polar source voltage and having a primary winding and a secondary winding is provided. The FET drive circuit includes a FET having a gate, a drain and a source. It also includes a first diode having a first terminal coupled to a first terminal of the secondary winding and a second terminal coupled to the gate of the FET. The drive circuit is further provided with a transistor having a base, an emitter and a collector. The emitter of the transistor is coupled to the gate of the FET; and, the collector of the transistor is coupled to the source of the FET. The drive circuit further includes a second diode having a first terminal coupled to the first terminal of the first diode and a second terminal coupled to the base of the transistor. The second diode has a reverse recovery time which is longer than the reverse recovery time of the first diode.

Preferably, when a voltage at the first terminal of the secondary winding switches from a first polarity to a second polarity, the first diode blocks current flow away from the gate of the FET.

In the preferred embodiment, when a voltage at the first terminal of the secondary winding switches from a first polarity to a second polarity, the transistor turns-on to thereby dissipate a gate charge of the FET. Preferably, the gate charge of the FET is dissipated in less than approximately 50 ns.

Preferably, after expiration of the second reverse recovery time, the transistor turns-off and the first terminal of the secondary winding remains at the second polarity for a predefined time period to reset a core of the transformer.

In the preferred embodiment, the gate voltage of the FET is unipolar.

In accordance with another aspect of the invention, a FET drive circuit is provided for use with a transformer driven by a bi-polar source voltage and having a primary winding and a secondary winding. The FET drive circuit comprises a FET having a gate and first and second terminals; and a transistor coupled between the gate and one of the first and second terminals of the FET. The drive circuit is also provided with a first diode coupled to permit current flow to the gate of the FET when a voltage at a first terminal of the secondary winding of the transformer has a first polarity, and to block current flow away from the gate of the FET when the voltage at the first terminal of the secondary winding has a second polarity opposite the first polarity. It also includes a second diode having a reverse recovery time greater than the reverse recovery time of the first diode. The second diode is coupled to block current flow away from the control terminal of the transistor when the voltage at the first terminal of the secondary winding switches from the first polarity to the second polarity and after expiration of the reverse recovery time associated with the second diode.

Preferably, when the voltage at the first terminal switches from the first polarity to the second polarity, the first diode blocks current flow away from the FET sooner than the second diode blocks current flow away from the control terminal of the transistor such that the transistor turns on to thereby dissipate a gate charge associated with the FET.

In accordance with yet another aspect of the invention, a FET drive circuit is provided for use with a FET having a gate, a drain and a source, and with a transformer driven by a bi-polar source voltage and having a primary winding and a secondary winding. The FET drive circuit comprises a first diode coupled to the gate of the FET and having a first reverse recovery time; a transistor coupled between the gate and the source of the FET; and, a second diode coupled to the base of the transistor. The second diode has a second reverse recovery time which is longer than the first reverse recovery time.

In the preferred embodiment, each of the first and second diodes has an anode, and the anodes are coupled to one another.

In accordance with still another aspect of the invention, a FET drive circuit is provided for use with a FET having a gate and first and second terminals, and with a transformer driven by a bi-polar source voltage and having a primary winding and a secondary winding. The FET drive circuit comprises a transistor coupled between the gate and one of the first and second terminals of the FET. The drive circuit is also provided with a first diode coupled to permit current flow to the gate of the FET when a voltage at a first terminal of the secondary winding of the transformer has a first polarity, and to block current flow away from the gate of the FET when the voltage at the first terminal of the secondary winding has a second polarity opposite the first polarity. It also includes a second diode having a reverse recovery time greater than the reverse recovery time of the first diode. The second diode is coupled to block current flow away from the control terminal of the transistor when the voltage at the first terminal of the secondary winding switches from the first polarity to the second polarity and after expiration of the reverse recovery time associated with the second diode.

Other features and advantages are inherent in the apparatus claimed and disclosed or will become apparent to those skilled in the art from the following detailed description and its accompanying drawings.

BRIEF DESCRIPTION OF THE DRAWING

The Figure is a schematic illustration of a FET drive circuit constructed in accordance with the teachings of the instant invention.

DESCRIPTION OF THE PREFERRED EMBODIMENT

A drive circuit 10 constructed in accordance with the teachings of the invention is shown in the Figure. Although the disclosed drive circuit 10 is shown driving a Junction Field Effect Transistor (JFET) 20, persons of ordinary skill in the art will appreciate that the circuit 10 is not limited to use with any particular type of field effect transistor. On the contrary, the drive circuit 10 can be employed to drive any FET without departing from the scope of the invention. For simplicity of discussion, as used in this description and the appended claims, the term "FET" is defined to include all field effect transistors including, but not limited to, MOSFETs (Metal Oxide Semiconductor Field Effect Transistors) and JFETs.

As shown in the Figure, the drive circuit 10 is adapted for use with a conventional transformer 30 coupled to a bi-polar source voltage. The transformer 30 includes a primary winding 32, a core 34, and a secondary winding 36 as schematically illustrated in the Figure. Preferably, the transformer 30 is a tightly coupled pulse transformer designed for use at a frequency of approximately 100 Khz. Preferably, the bi-polar source voltage is developed by a conventional AC voltage source which induces a voltage swing between +15 Volts and −15 Volts at the secondary winding of the transformer 30.

The drive circuit 10 itself preferably comprises a transistor 40, a first diode 50, a second diode 60, and biasing resistors 70, 80, and 90. The transistor 40 is of conventional design and includes a base or control terminal 42, an emitter 44 and a collector 46. In the illustrated embodiment, the emitter 44 of the transistor 40 is coupled to the gate 22 of the FET 20, and the collector 46 of the transistor 40 is coupled to the source 24 of the FET 20. Preferably, the transistor 40 is implemented by a PNP transistor such as a Zetex ZTX751 transistor.

Significantly, the first diode 50 is coupled in the drive circuit 10 to permit current flow to the gate 22 of the FET 20 when a voltage at the dotted terminal of the secondary winding 36 of the transformer 30 has a positive polarity, and to block current flow away from the gate 22 when the voltage at the dotted terminal of the secondary winding 36 has a negative polarity and after expiration of a reverse recovery time associated with the first diode 50. Also, the second diode 60 is coupled in the drive circuit 10 to block current flow away from the base 42 of the transistor 40 when the voltage at the dotted terminal of the secondary winding 36 switches from the positive to the negative polarity and after expiration of the reverse recovery time associated with the second diode 60.

As illustrated in the Figure, the anode of the first diode 50 is connected to the resistor 90 and to the gate 22 of the FET. The anode of the second diode 60 is coupled to the resistor 80 and to the base 42 of the transistor 40. The anodes of the first and second diodes 50, 60 are connected to each other and to one terminal of the resistor 70. The opposite terminal of the resistor 70 is coupled to a first terminal of the secondary winding 36. A second terminal of the secondary winding 36 is coupled to the resistors 80, 90, to the collector 46 of the transistor 40, to the source 24 of the FET 20, and to ground as shown in the Figure.

In accordance with an important aspect of the invention, the first and second diodes 50, 60 are implemented such that the reverse recovery time of the second diode 60 is longer than the reverse recovery time of the first diode 50. As a result, when the polarity of the voltage at the dotted terminal of the secondary winding 36 switches from positive to negative, the first diode 50 blocks current flow away from the FET 20 sooner than the second diode 60 blocks current flow away from the control terminal 42 of the transistor 40. Consequently, the transistor 40 turns-on to thereby quickly dissipate the gate charge of the FET whenever the polarity of the voltage at the dotted terminal of the secondary winding 36 switches from positive to negative. After expiration of the second diode's reverse recovery time, the transistor 40 turns-off and the dotted terminal of the secondary winding remains negative for a predefined time period to reset the core of the transformer 30.

More specifically, when the AC power source drives the dotted terminal of the transformer 30 to a positive voltage (such as ±15V), the voltage across the secondary charges the gate capacitance of the FET 20 through resistor 70 and diode 50. Diode 60 ensures that the transistor 40 will not turn on while the FET 20 is on.

When the voltage across the pulse transformer 30 is reversed, the dotted terminal of the secondary winding 36 goes negative (e.g., −15V) and diode 50 quickly blocks reverse current from flowing away from the gate of the FET 20. However, the diode 60 is selected to have a relatively long reverse recovery charge time such that, upon reversal of the transformer voltage, the transistor 40 will turn-on and quickly dissipate the gate charge of the FET 20. This has the result of turning the FET 20 off very quickly (for example, within 50 ns). Once the recovery charge time of the diode 60 expires, the load current through the transistor 40 terminates, and the voltage across the transformer 30 can remain negative to reset the transformer core without supplying further load current.

As mentioned above, the first and second diodes 50, 60 are implemented such that the reverse recovery time of the first diode 50 is shorter than the reverse recovery time of the second diode 60. Preferably, the difference in these recovery times is on the order of 1 μsec. By way of example, not limitation, the first diode 50 may be implemented as 1N4148 diode or as a Schottky diode such as a 1N5819 diode, and the second diode 60 may be implemented as a 1N4002 diode. Persons of ordinary skill in the art will appreciate, however, that other diodes could be used in these roles without departing from the scope of the invention.

Persons of ordinary skill in the art will also appreciate that, although in the illustrated embodiment the resistors 70, 80 and 90 are respectively implemented by 10 ohm, 1 Kohm, and 10 Kohm resistors, other resistors may be employed in these roles without departing from the scope or spirit of the invention. Similarly, persons of ordinary skill in the art will appreciate that although the transistor 40 is preferably implemented as a Zetex ZTX751 transistor, other devices could be employed in this role without departing from the scope or the spirit of the invention.

Advantageously, the value of the resistor 70 can be selected to ensure the turn-on of the FET 20 is soft. A soft turn-on is desirable to minimize EMI or peak currents in switchmode circuits. As mentioned above, in the preferred embodiment, the value of the resistor 70 is 10 ohms.

In addition to the soft turn-on and fast turn-off attributes mentioned above, persons of ordinary skill in the art will appreciate that the low off-state impedance of the FET 20 advantageously provides the circuit with enhance noise immunity. The circuit 10 is also advantageous in that the gate voltage of the FET 20 does not go negative. Rather, this gate voltage swings between a positive voltage and zero volts. Thus, the disclosed circuit 10 does not waste energy driving the FET gate negative and returning it to an appropriate positive level for the next turn-on. In other words, the FET 20 is provided with a uni-polar gate voltage.

Although certain instantiations of the teachings of the invention have been described herein, the scope of coverage of this patent is not limited thereto. On the contrary, this patent covers all instantiations of the teachings of the invention fairly falling within the scope of the appended claims either literally or under the doctrine of equivalents.

What is claimed is:

1. For use with a transformer driven by a bi-polar source voltage and having a primary winding and a secondary winding, a FET drive circuit comprising:

a FET having a gate, a drain and a source;

a first diode having a first terminal coupled to a first terminal of the secondary winding and a second terminal coupled to the gate of the FET, the first diode having a first reverse recovery time;

a transistor having a base, an emitter and a collector, the emitter of the transistor being coupled to the gate of the FET, the collector of the transistor being coupled to the source of the FET; and, a second diode having a first terminal coupled to the first terminal of the first diode and a second terminal coupled to the base of the transistor, the second diode having a second reverse recovery time, the second reverse recovery time being longer than the first reverse recovery time.

2. A FET drive circuit as defined in claim 1 wherein, when a voltage at the first terminal of the secondary winding switches from a first polarity to a second polarity, the first diode blocks current flow away from the gate of the FET.

3. A FET drive circuit as defined in claim 1 wherein, when a voltage at the first terminal of the secondary winding switches from a first polarity to a second polarity, the transistor turns-on to thereby dissipate a gate charge of the FET.

4. A FET drive circuit as defined in claim 3 wherein the gate charge of the FET is dissipated in less than approximately 50 ns.

5. A FET drive circuit as defined in claim 1 wherein, after expiration of the second reverse recovery time, the transistor turns-off and the first terminal of the secondary winding remains at the second polarity for a predefined time period to reset a core of the transformer.

6. A FET drive circuit as defined in claim 1 wherein the first diode comprises an 1N4148 diode and the second diode comprises a 1N4002 diode.

7. A FET drive circuit as defined in claim 1 wherein the first diode comprises a Schottky diode.

8. A FET drive circuit as defined in claim 1 wherein the transistor comprises a PNP transistor.

9. A FET drive circuit as defined in claim 1 wherein the FET has a low off-state impedance.

10. A FET drive circuit as defined in claim 1 wherein a gate voltage of the FET is unipolar.

11. For use with a transformer driven by a bi-polar source voltage and having a primary winding and a secondary winding, a FET drive circuit comprising:

a FET having a gate and first and second terminals;

a transistor coupled between the gate and one of the first and second terminals of the FET, the transistor having a control terminal;

a first diode coupled to permit current flow to the gate of the FET when a voltage at a first terminal of the secondary winding of the transformer has a first polarity, and to block current flow away from the gate of the FET when the voltage at the first terminal of the secondary winding has a second polarity opposite the first polarity, the first diode having a reverse recovery time; and a second diode having a reverse recovery time greater than the reverse recovery time of the first diode, the second diode being coupled to block current flow away from the control terminal of the transistor when the voltage at the first terminal of the secondary winding switches from the first polarity to the second polarity and after expiration of the reverse recovery time associated with the second diode.

12. A FET drive circuit as defined in claim 11 wherein, when the voltage at the first terminal switches from the first polarity to the second polarity, the first diode blocks current flow away from the FET sooner than the second diode blocks current flow away from the control terminal of the transistor such that the transistor turns on to thereby dissipate a gate charge associated with the FET.

13. A FET drive circuit as defined in claim 11 wherein the FET is provided with a unipolar gate charge.

14. A FET drive circuit as defined in claim 11 wherein the transistor is coupled between the gate and a source of the FET.

15. A FET drive circuit as defined in claim 11 wherein, after expiration of the second reverse recovery time, the transistor turns-off and the first terminal of the secondary winding remains at the second polarity for a predefined time period to reset a core of the transformer.

16. A FET drive circuit as defined in claim 11 wherein the first diode comprises an 1N4148 diode and the second diode comprises a 1N4002 diode.

17. A FET drive circuit as defined in claim 11 wherein the first diode comprises a Schottky diode.

18. A FET drive circuit as defined in claim 11 wherein the transistor comprises a PNP transistor.

19. A FET drive circuit as defined in claim 11 wherein the FET has a low off-state impedance.

20. For use with a FET having a gate, a drain and a source, and with a transformer driven by a bi-polar source voltage and having a primary winding and a secondary winding, a FET drive circuit comprising:

a first diode coupled to the gate of the FET and having a first reverse recovery time;

a transistor coupled between the gate and the source of the FET; and, a second diode coupled to the base of the transistor, the second diode having a second reverse recovery time, the second reverse recovery time being longer than the first reverse recovery time.

21. A FET drive circuit as defined in claim 20 further comprising a FET.

22. A FET drive circuit as defined in claim 20 wherein each of the first and second diodes has an anode, and the anodes are coupled to one another.

23. For use with a FET having a gate and first and second terminals, and a transformer driven by a bi-polar source voltage and having a primary winding and a secondary winding, a FET drive circuit comprising:

a transistor coupled between the gate and one of the first and second terminals of the FET, the transistor having a control terminal;

a first diode coupled to permit current flow to the gate of the FET when a voltage at a first terminal of the secondary winding of the transformer has a first polarity, and to block current flow away from the gate of the FET when the voltage at the first terminal of the secondary winding has a second polarity opposite the first polarity, the first diode having a reverse recovery time; and a second diode having a reverse recovery time greater than the reverse recovery time of the first diode, the second diode being coupled to block current flow away from the control terminal of the transistor when the voltage at the first terminal of the secondary winding switches from the first polarity to the second polarity and after expiration of the reverse recovery time associated with the second diode.

24. A FET drive circuit as defined in claim 23 further comprising a FET.

\* \* \* \* \*